(12) United States Patent
Mosalikanti et al.

(10) Patent No.: US 11,847,011 B2
(45) Date of Patent: Dec. 19, 2023

(54) FREQUENCY OVERSHOOT AND VOLTAGE DROOP MITIGATION APPARATUS AND METHOD

(71) Applicant: Intel Corporation, Santa Clara, CA (US)

(72) Inventors: Praveen Mosalikanti, Portland, OR (US); Nasser A. Kurd, Portland, OR (US); Alexander Gendler, Kiriat Motzkin (IL)

(73) Assignee: Intel Corporation, Santa Clara, CA (US)

( * ) Notice: Subject to any disclaimer, the term of this patent is extended or adjusted under 35 U.S.C. 154(b) by 397 days.

(21) Appl. No.: 17/181,832

(22) Filed: Feb. 22, 2021

(65) Prior Publication Data

US 2021/0181831 A1 Jun. 17, 2021

Related U.S. Application Data

(63) Continuation of application No. 16/285,051, filed on Feb. 25, 2019, now Pat. No. 10,928,886.

(51) Int. Cl.
*G06F 1/3296* (2019.01)
*H03L 7/093* (2006.01)
(Continued)

(52) U.S. Cl.
CPC ....... *G06F 1/3296* (2013.01); *G01R 19/2513* (2013.01); *H03K 5/24* (2013.01);
(Continued)

(58) Field of Classification Search
CPC ....... G06F 1/3296; H03L 7/093; H03L 7/095; G01R 19/2513; H03K 5/24; H03K 19/20
See application file for complete search history.

(56) References Cited

U.S. PATENT DOCUMENTS 8,378,738 B1 * 2/2013 Zhu ................. G06F 1/3296
327/158
8,892,922 B2 * 11/2014 Frank ............... G06F 1/3296
713/340
(Continued)

OTHER PUBLICATIONS

International Preliminary Report on Patentability dated Jul. 10, 2020 for PCT Patent Application No. PCT/US2020/013389.
(Continued)

*Primary Examiner* — Terrell S Johnson
(74) *Attorney, Agent, or Firm* — Schwabe, Williamson & Wyatt, P.C.

(57) ABSTRACT

An apparatus and method are described, which prior to an event that could result in frequency overshoot, sends a signal to a voltage regulator or generator requesting a temporary supply voltage and/or current boost. This enables a clocking source, such as a phase locked loop (PLL) to lock fast while not needing any long-term voltage guard bands. The apparatus and scheme allows for on-the-fly change in supply voltage and/or clock frequency for a processor with little to no impact on Vmin. During the clock frequency overshoot, the supply voltage is temporarily boosted and then reduced down to the expected voltage level of the power supply. Such boost allows for absorbing the clock frequency overshoot impact. The supply voltage level can be reduced in a step-wise fashion to avoid any potential undershoot in clock frequency.

11 Claims, 11 Drawing Sheets

(51) Int. Cl.
    *G01R 19/25*     (2006.01)
    *H03L 7/095*     (2006.01)
    *H03K 5/24*     (2006.01)
    *H03K 19/20*     (2006.01)

(52) U.S. Cl.
    CPC ............. *H03K 19/20* (2013.01); *H03L 7/093* (2013.01); *H03L 7/095* (2013.01)

(56) References Cited

U.S. PATENT DOCUMENTS

| | | |
|---|---|---|
| 9,606,602 B2 | 3/2017 | Suryanarayanan et al. |
| 2010/0060342 A1 | 3/2010 | Rozen et al. |
| 2010/0188158 A1 | 7/2010 | Ainspan et al. |
| 2014/0266119 A1 | 9/2014 | Burton et al. |
| 2015/0198933 A1 | 7/2015 | Coutts |
| 2017/0005665 A1 | 1/2017 | Swaminathan et al. |
| 2018/0018009 A1 | 1/2018 | Kommrusch et al. |

OTHER PUBLICATIONS

International Search Report & Written Opinion dated May 8, 2020 for PCT Patent Application No. PCT/US2020/013389.

Non-Final Office Action dated Jun. 26, 2020 for U.S. Appl. No. 16/285,051.

Notice of Allowance dated Oct. 7, 2020 dated Jun. 26, 2020 for U.S. Appl. No. 16/285,051.

\* cited by examiner

# US 11,847,011 B2

FREQUENCY OVERSHOOT AND VOLTAGE DROOP MITIGATION APPARATUS AND METHOD

CLAIM FOR PRIORITY

This application is a continuation of, and claims the benefit of priority to U.S. patent application Ser. No. 16/285,051, filed on Feb. 25, 2019, titled "FREQUENCY OVERSHOOT AND VOLTAGE DROOP MITIGATION APPARATUS AND METHOD," and which is incorporated by reference in entirety.

BACKGROUND

When a phase locked loop (PLL) experiences a phase or frequency change event (e.g., exit from adaptive frequency scaling (AFS) scheme, supply voltage transitions, frequency and power supply voltage/current transitions, etc.), the PLL exhibits frequency overshoot when an accumulated phase error is being corrected by the PLL. This frequency overshoot can force the supply voltage of a compute subsystem (e.g., logic, IO lanes, core, graphics, etc.) clocked by the PLL to be set higher than would be required for operating at the target frequency. This frequency overshoot can result in an increase in supply voltage guard bands, which negatively impact system performance or limit the extent to which AFS or fast DVFS (Dynamic Voltage Frequency Scaling) techniques can be used. To mitigate the effects of frequency overshoot (or undershoot), designers either increase supply voltage guard bands for the compute subsystems or overdamp the PLL. Such mitigation techniques significantly increase PLL lock/relock time and negatively impact computer system performance (e.g., approximately 5% to 8% frequency overshoot can significantly increase Vmin to absorb the frequency overshoot), where Vmin is the minimum operating voltage for the compute subsystems below which its functionality is compromised.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
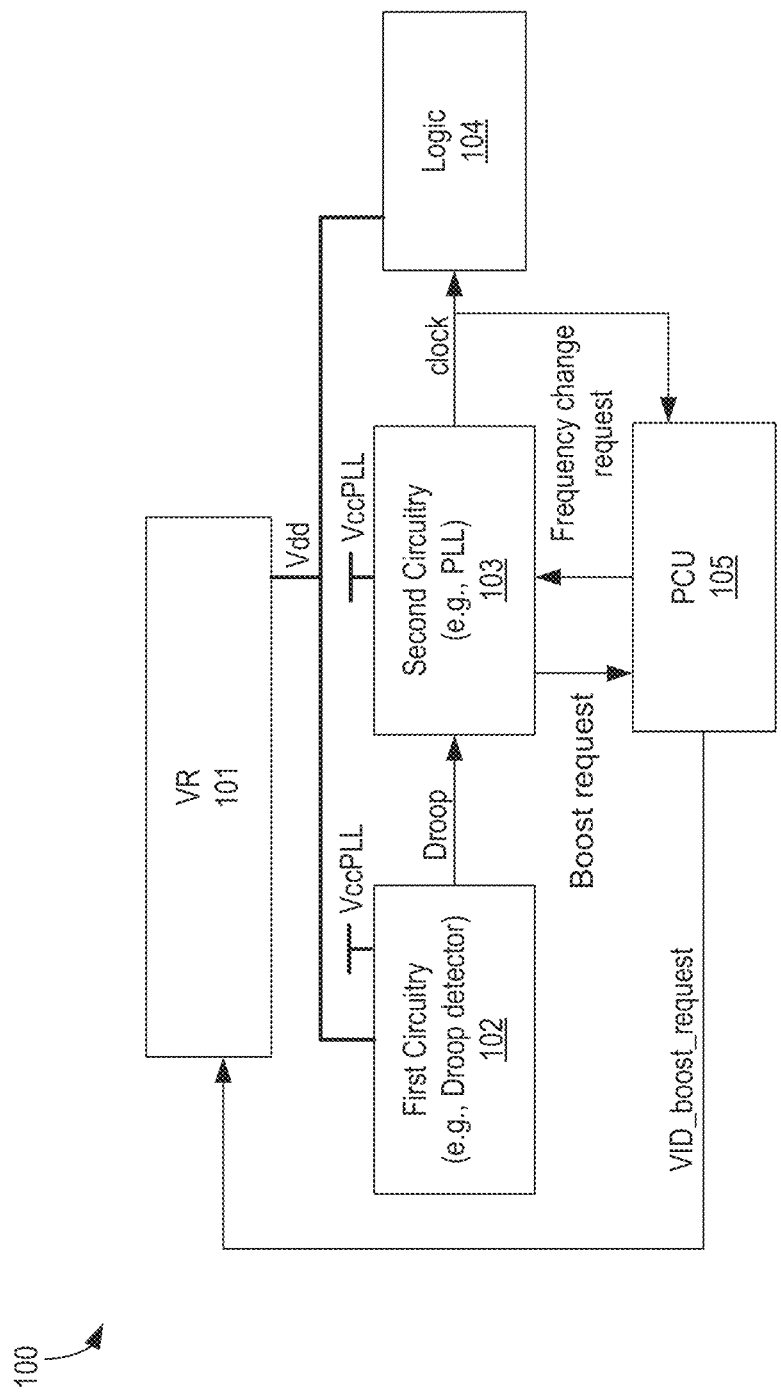
FIG. 1 illustrates an architecture to boost supply voltage of a subsystem logic (e.g., processor core, graphics unit, etc.) upon detecting a voltage droop, according to some embodiments of the disclosure.

In some embodiments, an apparatus is described, which prior to an event that could result in frequency overshoot, sends a signal to a voltage regulator or supply generator requesting a temporary supply voltage and/or current boost. This enables a clocking source, such as a phase locked loop (PLL), or frequency locked loop (FLL) to lock fast while not needing any long-term voltage guard bands. There are many technical effects for the various embodiments. For example, minimum operating voltage (Vmin) is not raised to mitigate clock frequency overshoot from supply voltage droop, and as such, processor performance is improved because unnecessary timing guard band (e.g., frequency and voltage guard band) is not needed. The apparatus and scheme of various embodiments allow for on-the-fly change in supply voltage and/or clock frequency for a processor with little to no impact on Vmin During the clock frequency overshoot, the supply voltage is temporarily boosted and then reduced down to the expected voltage level of the power supply. Such boost allows for absorbing the clock frequency overshoot impact. The supply voltage level can be reduced in a step-wise fashion or a single step. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates architecture 100 (or processor 100) to boost supply voltage of a logic core (e.g., compute system or subsystem, processor core, graphics cores, IO logic etc.), clocked by a clocking source, upon detecting a voltage droop on a voltage on a power supply rail, according to some embodiments of the disclosure. Architecture 100 comprises voltage generator 101, first circuitry 102 (e.g., droop detector), second circuitry 103 (e.g., clocking source), logic 104 (e.g., processor core, cache, Input-output buffers), and power control unit (PCU) 105. While architecture 100 illustrates one voltage generator 101, more voltage generators can be used in a distributed fashion. In some embodiments, voltage generator 101 comprises a fully integrated voltage regulator (FIVR). In some embodiments, voltage generators 101 comprises one or more low dropout (LDO) regulators. These LDOs can be analog LDOs, all-digital LDOs, or mixed-signal LDOs. Any suitable voltage generator can be used for voltage generators 101 that can receive one or more requests to change its power supply output Vdd, and that can adjust the power supply level of Vdd accordingly. Here, voltage generator 101 is identified as a voltage regulator (VR) which may have active and/or passive components.

In some embodiments, first circuitry 102 detects a droop in Vdd (e.g., sudden voltage drop in Vdd on Vdd power supply rail), and issues a Droop signal. Vdd is the power supply provided to one or more logic circuits of a processor. This droop in Vdd can be caused by a variety of reasons such as sudden demand of current draw by logic 104 to perform a function. The droop can also be caused by a sudden jump of processor performance level from normal mode to turbo mode (e.g., high performance mode). Upon recognizing a droop in Vdd, second circuitry 103 instructs or requests VR 101 via Boost request signal to increase (or boost) the supply level of Vdd for a short period of time.

In some embodiments, second circuitry 103 sends the Boost request to PCU 105 to increase supply voltage Vdd, and PCU 105 then sends a VID_boost_request to VR 101 to increase Vdd. In this example, PCU 105 plays the role of central power management. However, the embodiments are not limited to such, and VR 101 may receive instructions directly from other circuits (e.g., PLL or FLL of second circuitry 103) to adjust power supply Vdd. Here, VID_boost_request may be a single bit signal or a multi-bit code indicating voltage identification (VID) for VR 101.

Second circuitry 103 provides clock to logic 104, which also operates on Vdd controlled and regulated by VR 101. For example, a PLL or FLL of second circuitry 103 generates a phase or frequency locked clock for use by logic 104 and/or other circuitries such as PCU 105. In some embodiments, second circuitry 103 requests a supply boost of Vdd of a specific magnitude (Vboost) for a certain minimum duration (Tpw) to ensure that any potential frequency overshoot can be absorbed before restoring the voltage Vdd to its nominal or expected level. Vdd can then be reduced after the temporary boost in one or multiple voltage steps each of magnitude, Vstep and duration, Tstep. In various embodiments, the clocking source of second circuitry 103 operates on a different power supply than Vdd. In this example, the clock source (e.g., PLL) of second circuitry 103 operates on VccPLL which is separate from Vdd in terms of noise characteristics, supply distribution, etc.

In some embodiments, PCU 105 sends a frequency change request to second circuitry 103. For example, processor 100 enters into a high performance mode (such as Turbo mode) from a normal mode or low power mode and requests an increase in frequency of clock. In that case, PCU 105 may request VID boost in response to frequency change request. This VID_boost_request causes VR 101 to temporarily increase Vdd above its already elevated level to accommodate frequency request change, for example. In some embodiments, PCU 105 sends a request to PLL 103 for frequency crawl and sends a request to VR 101 to ramp voltage supply Vdd. In that case, PCU 105 sends VID_boost_request just before the last or second to last frequency step of the frequency crawl process. VR 101 then further increases or boosts Vdd during the last or second to last frequency step of the frequency crawl process, and then slowly steps Vdd down to its new expected level. This temporary boost in Vdd maintains the Vmin for processor 100 and so the additional guard band, otherwise needed to account for frequency overshoot from the frequency crawl process or the frequency change request, is avoided and Vmin is not raised.

Figure 2A:
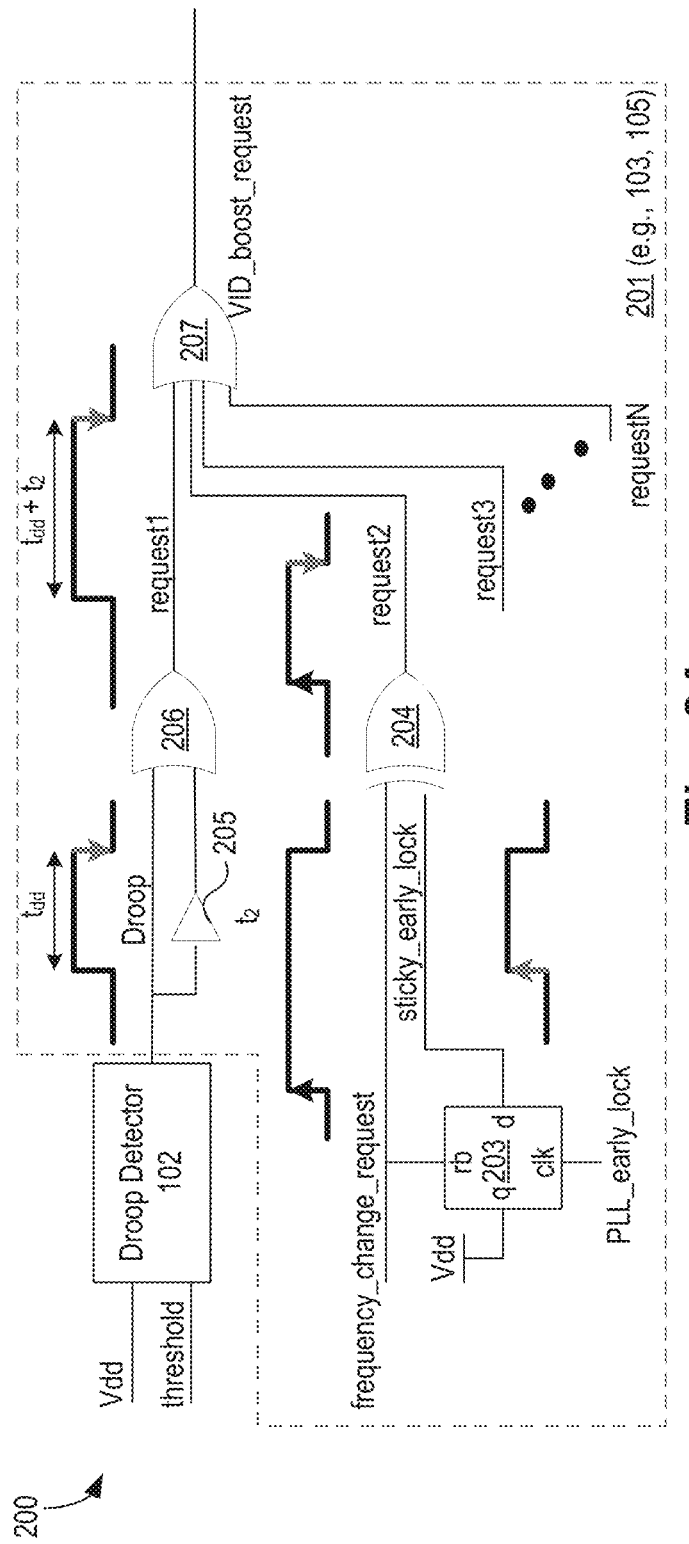
FIGS. 2A-B illustrate a schematic to boost supply voltage of a logic (e.g., core, graphics, etc.) upon detecting a voltage droop, and associated timing diagram, respectively, in accordance with some embodiments.
Figure 2B:
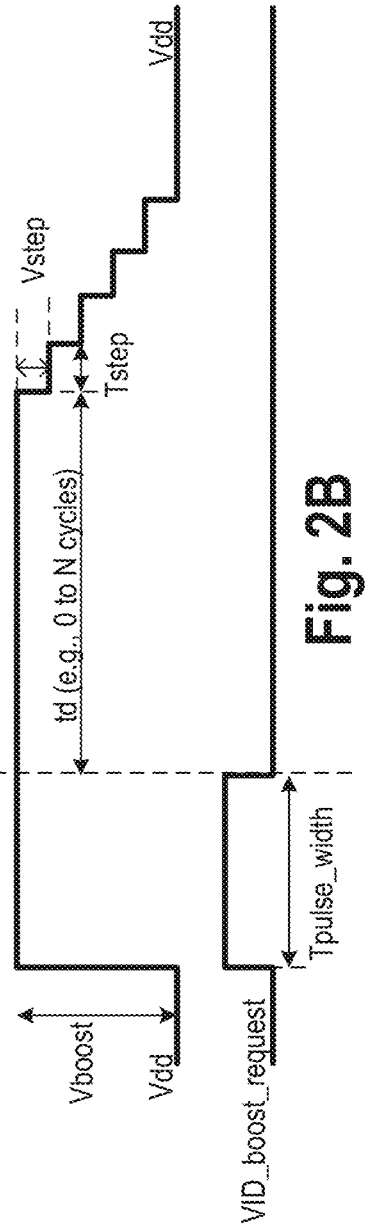

FIGS. 2A-B illustrate schematic 200 to boost supply voltage of the core (e.g., logic core, graphics system, or any other compute system clocked by a clocking source) upon detecting a voltage droop, and associated timing diagram 220, respectively, in accordance with some embodiments. Schematic 200 comprises droop detector 102 and logic 201 of second circuitry 103 and/or PCU 105. In some embodiments, logic 201 comprises sequential unit 203 such as a latch or flip-flop, OR logic gates 204 and 207, XOR gate 204, and buffer 205. A person skilled in the art would appreciate that various logic gate can be replaced with equivalent gates to perform the same overall function. For example, DeMorgan's law can be applied to the logic function and OR gates can be replaced with NOR gates etc.

VID_boost_request can be generated by PLL, FLL 103 for any AFS or frequency change event (e.g., frequency crawl or supply voltage transitions). In some embodiments, droop detector 102 senses Vdd (or a version of Vdd) with a threshold (e.g., a programmable or fixed threshold) and sends out indication of a droop in the form of a 1-bit Droop signal. In some embodiments, the 1-bit Droop signal is a pulse with a pulse width $t_{dd}$. The pulse width is extended by time $t_2$ using buffer 205 (or any other suitable delay scheme) having propagation delay of $t_2$ and OR-ing Droop pulse with the output of buffer 205 by OR gate 206. As such, request1 signal having pulse width of $t_{dd}+t_2$ is generated. If request1 pulse is generated (e.g., because of a detected droop on Vdd), OR gate 207 generates a VID_boost_request signal for VR 101 to temporality increase the voltage level of Vdd. In some embodiments, delay $t_2$ of buffer 205 is programmable. For example, delay $t_2$ of buffer 205 can be adjusted by software (operating system) or hardware (e.g., fuses).

In this example, since the clock frequency is restored on the falling edge of the droop detector's output Droop (see gray arrow on falling edge of pulse width), the falling edge is delayed by $t_2$ to ensure that the voltage ramp of Vdd leads the clock frequency change event. In some embodiments, PLL 103 generates early and final lock indications. In some embodiments, the early lock indication, PLL_early_lock, is used by flip-flop 203 along with the frequency_change_request to generate the duration for which a VID boost is needed for frequency transitions. PLL_early_lock, signal is received as a clock input of flip-flop 203 which samples Vdd. The output sticky_early_lock of flip-flop 203 is reset back to low logic when Frequency_change_request is de-asserted. XOR gate 204 then compares the sticky_early_lock signal with the Frequency_change_request and generates request2. Here, two possible requests for Vdd boost are shown. The first request, request1, is initiated by Droop while the second request, request2, is initiated by Frequency_change_request. However, more requests for temporary Vdd boost can be made from other architectural features, and these requests can be OR-ed together by OR gate 207 to generate VID_boost_request signal. For example, requests1 through requestN (where 'N' is an integer greater than 2) can be OR-ed by OR gate 207 to provide cases for temporary boosting of Vdd.

In some embodiments, the amount of Vdd boost (Vboost) is a programmable amount. Upon receiving VID_boost_request, VR 101 increases its output voltage Vdd by Vboost amount. Once VID_boost_request is de-asserted after Tpulse_width (which is a function of Droop pulse width tdd, assertion of PLL_early_lock, etc.), the process of reducing Vdd back to its previous value or an expected voltage level begins. For example, after zero to N counts of a clock (or a duration of td), boosted Vdd is reduced from its temporary boost level in one or multiple voltage steps each of magnitude, Vstep and duration, Tstep. In various embodiments, Tpulse_width and/or N is long enough to ensure that any potential clock frequency overshoot can be absorbed before restoring the voltage Vdd to its nominal or expected level.

Figure 3:
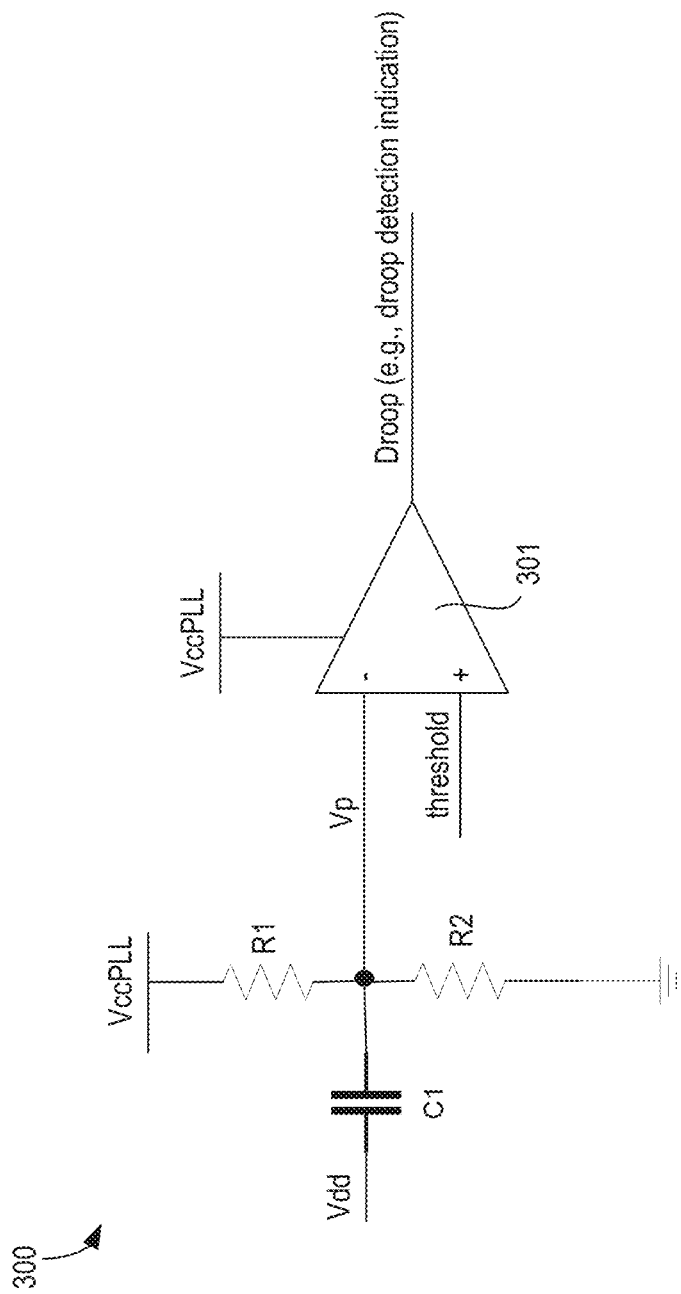
FIG. 3 illustrates a schematic of a voltage droop detector, which is used by the architecture to temporarily boost the supply voltage of a logic (e.g., processor core, graphics, etc.), in accordance with some embodiments.

FIG. 3 illustrates a schematic of a voltage droop detector 300, which is used by architecture or processor 100 to temporarily boost the supply voltage of core 104, in accordance with some embodiments. In some embodiments, voltage droop detector 300 comprises comparator 301, resistive devices R1 and R2, and coupling capacitor C1. Comparator 301 compares Vp with a threshold (e.g., programmable threshold). Here, the voltage of the power supply to be sensed is Vdd, which is coupled node Vp via coupling capacitor C1. As such, a filtered Vdd is coupled to node Vp. In some embodiments, a quiet, noiseless, or analog power supply VccPLL is provided to power comparator 301. In this example, VccPLL is also used by PLL or FLL 103. In some embodiments, comparator 301 is a clocked comparator with offset cancellation. In some embodiments, comparator 301 includes a latch and an amplifier.

In some embodiments, resistive devices R1 and R2 have programmable or adjustable resistance. Resistive devices R1 and R2 can be implemented as transistors operating in linear region, discrete resistors that may be on-die (e.g., poly) or off-chip, or a combination of both transistor and discrete resistors. In some embodiments, capacitor C1 is implemented as a transistor configured in a capacitor, a mesh of metal layers, a metal-insulator-metal capacitor, or any combination of them.

Figure 4:
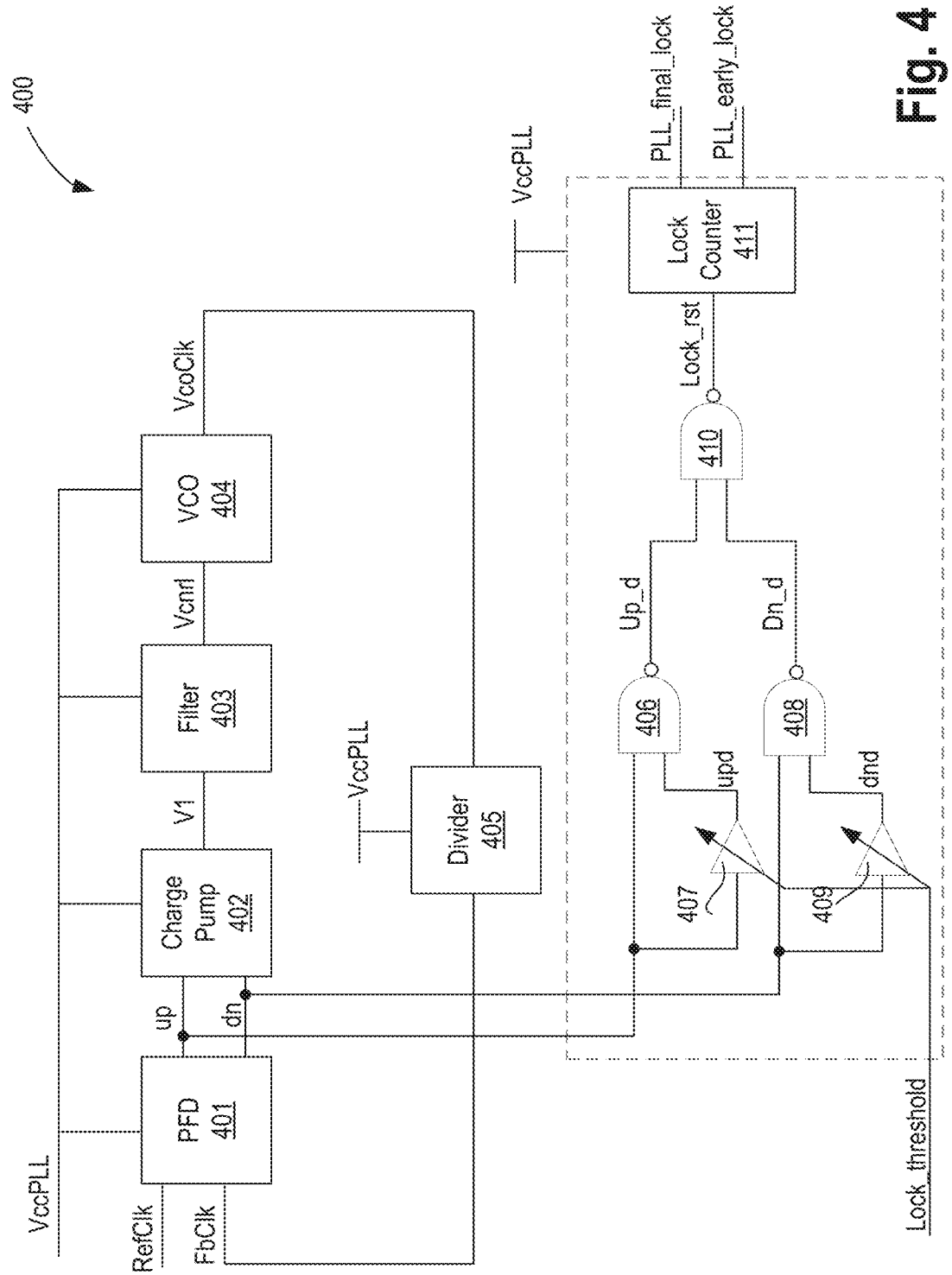
FIG. 4 illustrates a PLL with logic to generate early and late PLL lock indicators, which are used to control the duration of the temporary supply voltage boost, in accordance with some embodiments.

FIG. 4 illustrates PLL 400 (e.g., part of second circuitry 102) with logic to generate early and late PLL lock indicators, which are used to control the duration of the temporary supply voltage boost, in accordance with some embodiments. PLL 400 comprises phase detector 401 or phase frequency detector (PFD), charge pump 402, filter 403, voltage controlled oscillator (VCO) 404, divider 405, and a lock detector comprising first NAND gate 406, first adjustable delay buffer 407, second NAND gate 408, second adjustable delay buffer 409, third NAND gate 410, and Lock Counter 411 coupled together as shown.

The phase detector 401 receives a reference clock (RefClk) and a feedback clock (FbClk) and generates Up and Down (Dn) signals. Up and Dn signals are pulses that represent the relative phase different between the RefClk and the FbClk. Charge pump 402 receives the Up and Dn pulses and sources or sinks current on node V1. The signal on V1 is then filtered by filter 403 (such as a low pass filter (LPF)) to generate a filtered control voltage Vct1. Vct1 is then used to control the oscillating frequency of VCO 404. The output of VCO 404 is VcoClk. Divider 405 divides down the frequency of VcoClk by a divider ratio to generate FbClk. During PLL lock, Up and Dn signals provide evidence of dynamic phase error. The divider ratio can be programmable or fixed. The divider ratio can be an integer value or a fractional value. Dynamic phase error is the phase error between RefClk and FbClk before PLL is declared locked. A PLL is declared locked when the phase difference between RefClk and FbClk is below a predetermined threshold.

Some implementations of phase detector 401 use analog circuit techniques, while others use digital circuitry. The phase detector 401 can be designed to be sensitive to just phase or sensitive to frequency and to phase. When phase detectors are only sensitive to phases of RefClk and FbClk, they produce an output that is proportional to the phase difference between the two signals. When the phase difference between the RefClk and FbClk is steady, phase detector 401 produces a constant voltage. When there is a frequency difference between the two signals (RefClk and FbCLk), phase detector 401 produces a varying voltage. Example implementations of phase detectors 401 include diode based ring phase detector, exclusive OR phased phase detector, JK flip-flop based comparators, and dual D-type phase detectors. Generally, when a digital phase detector is to implement phase detector 401, short Up and Dn pulses are created by the logic gates of the digital phase detector. The static phase error is the pulse width difference between Up and Dn pulses, which is caused by leakage current and the charge pump current mismatch.

The lock detector first generates pulses Up_d and Dn_d from NAND gates 406 and 408, respectively, where the pulse widths of Up_d and Dn_d depend from outputs upd and dnd from adjustable delay buffers 407 and 409, respectively. The delays of buffers 407 and 409 are set by Lock_threshold, which sets the sensitivity of the locking indication. A longer delay through buffers 407 and 409 may indicate a higher tolerance of difference between Up and Dn signals to be considered as indictors of PLL lock. Conversely, a shorter delay through buffers 407 and 409 may indicate a lower tolerance of difference between Up and Dn signals to be considered as indicators of PLL Lock. The pulses Up_d and Dn_d are then compared by NAND 410, which generates a reset signal (Lock_rst) for lock counter 411. PLL_early_lock may be generated by the first bit of Lock Counter 411 while PLL_final_lock may be generated from the Nth bit of the N-bit Counter 411.

While PLL 400 is illustrated as an analog PLL, any type of PLL may be used to generate Clock by second circuitry 103. For example, mixed-signal PLL, all digital PLL, etc. may be used with a lock detection circuitry such as the one shown in FIG. 4 to generate early and late PLL lock indicators.

Figure 5:
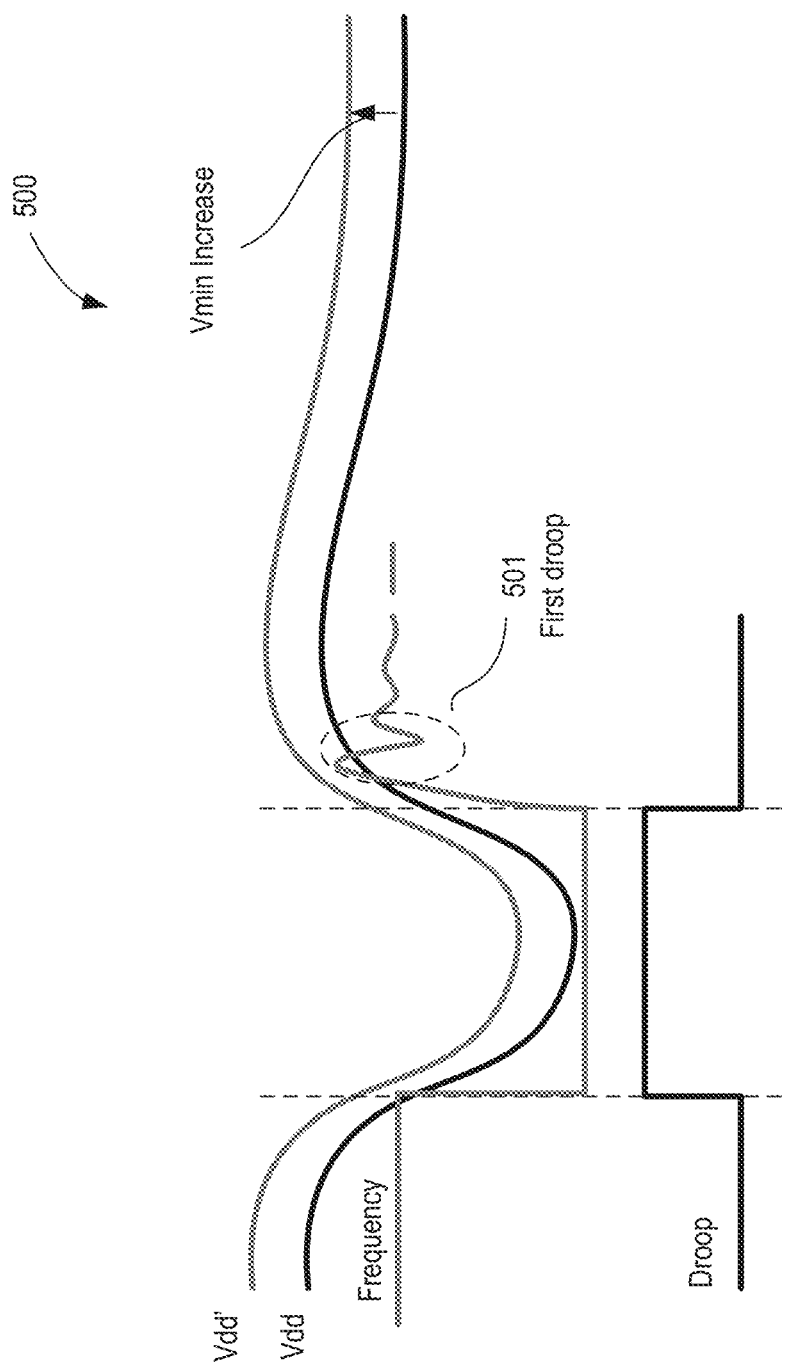
FIG. 5 illustrates a plot showing a potential impact of just using Adaptive Frequency Scaling (AFS) upon detecting a voltage droop.

FIG. 5 illustrates plot 500 showing impact of just using Adaptive Frequency Scaling (AFS) upon a voltage droop. Plot 500 shows a voltage droop on Vdd of Vdd power supply rail. The voltage droop by first circuitry 102 is indicated by the Droop signal. The pulse width of the droop signal indicates a duration of the voltage droop. Upon exiting the voltage droop, frequency overshoot 501 of the PLL clock is observed, wherein frequency overshoot 501 in this example has one droop. This frequency overshoot may be caused by an AFS exit event. The frequency overshoot forces raising of the processor's Vmin by effectively raising Vdd to Vdd', and this raised Vmin negatively affects normal operation of the processor by increasing power consumption and lowering processor performance.

Figure 6:
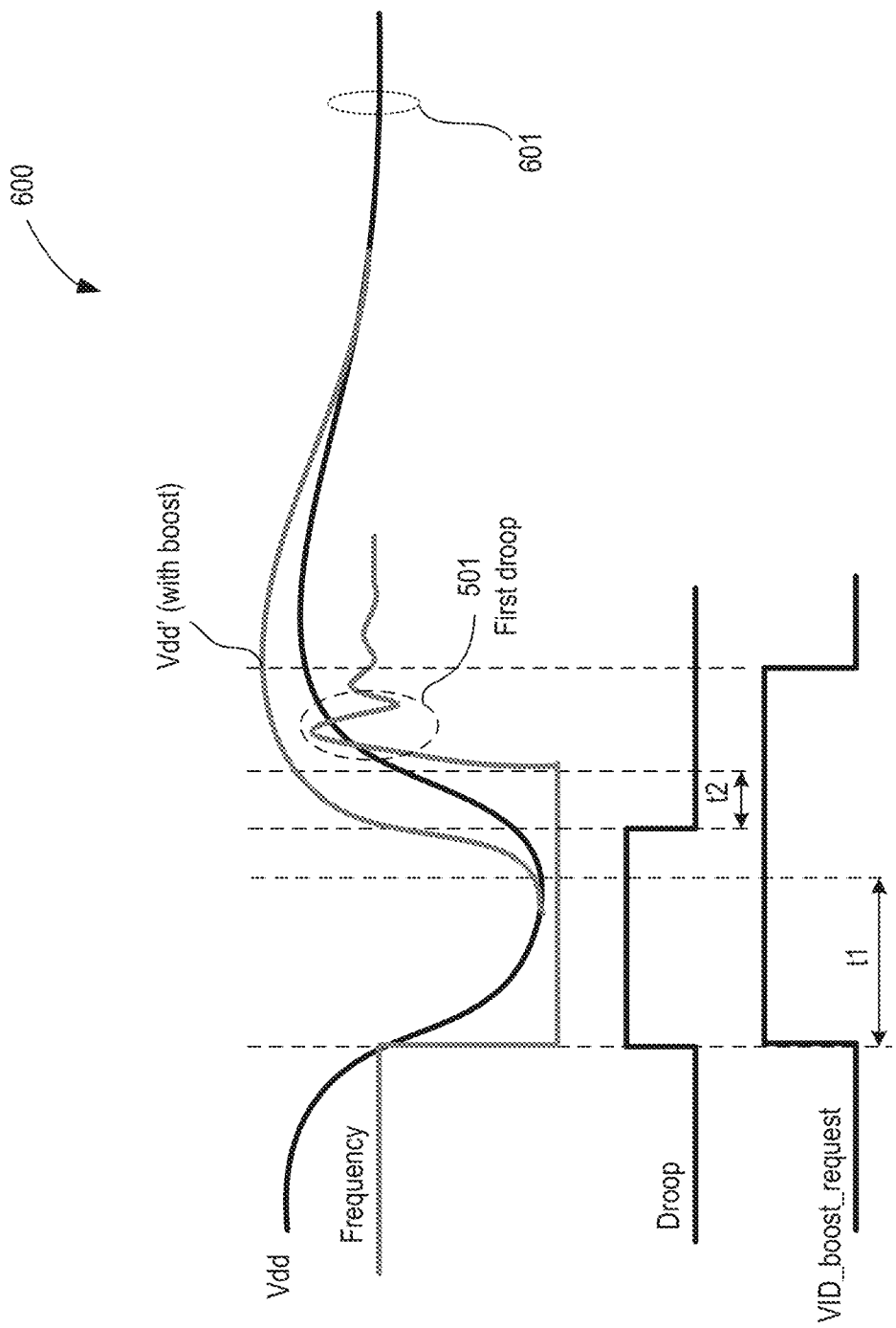
FIG. 6 illustrates a plot showing a temporary power supply voltage (and/or current) boost after a voltage droop without secondary droop, in accordance with some embodiments.

FIG. 6 illustrates plot 600 showing a temporary power supply voltage (and/or current) boost after a voltage droop without secondary droop, in accordance with some embodiments. In this example, second circuitry 103 (or the PLL or PCU 105) requests a temporary supply boost (VID boost) to absorb any frequency overshoot. The boost in Vdd may occur after t1 time duration from the time VID_boost_request is asserted. Here, t1 represents propagation delay between PLL 103 or PCU 105 to VR 101. For example, t1 includes PLL 103 or PCU 105 to VR 101 distribution latency and VR loop bandwidth latency. The boost in Vdd as shown by Vdd' is temporary and Vdd' is slowly lowered back to the expected Vdd level. In some embodiments, after Droop signal de-asserts, the process of slowly reducing Vdd' begins. Here t2 is the delay after Droop signal de-asserts (indicating an exit of the voltage droop) and is added to ensure Vdd' leads the clock frequency change. For example, Vdd' is higher than the frequency overshoot. This ensures that there is no long-term Vmin increase necessary as indicated by 601 where Vdd' (the boosted Vdd) reaches back to the expected Vdd. As such, Vmin increase penalty shown in plot 500 is eliminated. In various embodiments, the "t2" latency is provided to ensure that the voltage ramp for Vdd' leads the frequency recovery. The boosted supply Vdd' may need to remain boosted a little while longer than "t2" to ensure complete mitigation of frequency overshoot. As such, in some embodiments, the falling edge of VID_boost_request arrives either right after the "t2" delay latency or after the frequency has stabilized. The early lock indication of PLL 103 is a good indicator of when it is safe to turn off the Vdd' boost scheme.

Figure 7:
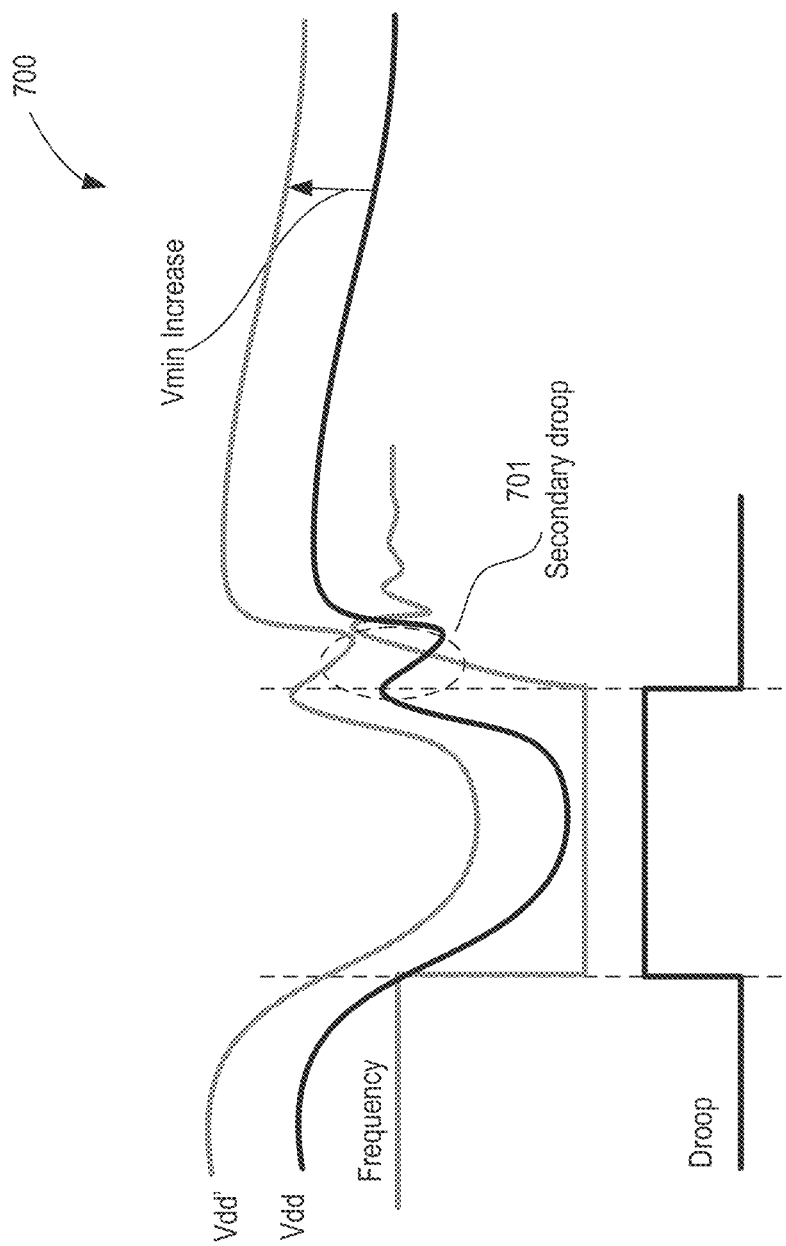
FIG. 7 illustrates a plot showing impact of just using AFS upon a voltage droop with secondary droop.

FIG. 7 illustrates plot 700 showing impact of just using AFS upon a voltage droop with secondary droop. Plot 700 is similar to plot 500 but with an additional voltage and frequency droop along with frequency overshoot. The additional droop is indicated by region 701. In the absence of temporary voltage boost scheme of various embodiments, Vmin for processor 100 is expected to rise to absorb the frequency overshoot.

Figure 8:
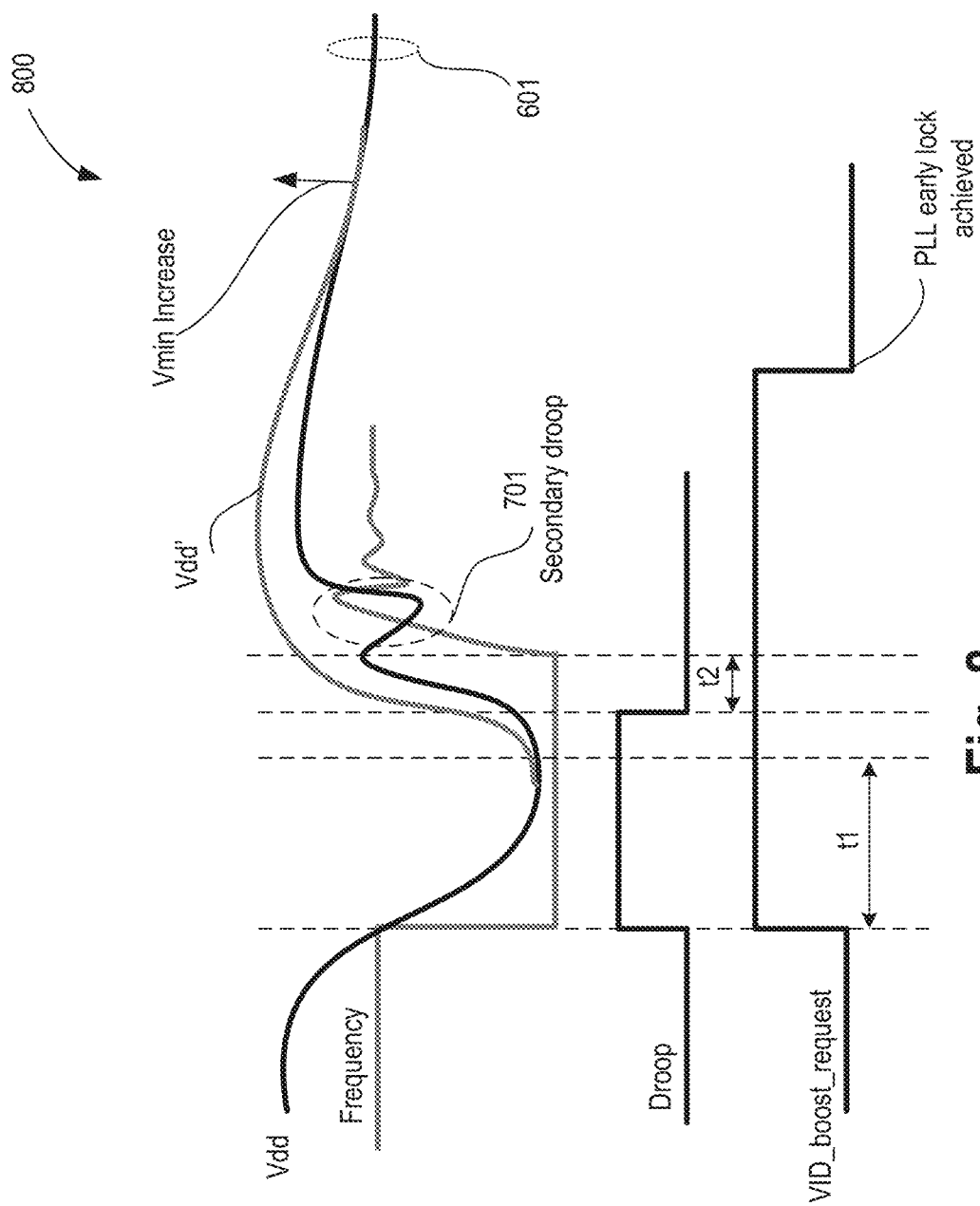
FIG. 8 illustrates a plot showing a temporary power supply voltage (and/or current) boost after a voltage droop with secondary droop, in accordance with some embodiments.

FIG. 8 illustrates plot 800 showing a temporary power supply voltage (and/or current) boost after a voltage droop with secondary droop, in accordance with some embodiments. Plot 800 is similar to plot 600 but with an additional voltage and frequency droop along with frequency overshoot. The additional droop is indicated by region 701. As discussed with reference to plot 600, the boost in Vdd as shown by Vdd' is temporary and Vdd' is slowly lowered back to the expected Vdd level. After Droop signal de-asserts, the process of slowly reducing Vdd' begins. Here t2 is the delay after Droop signal de-asserts (indicating an exit of the voltage droop) and is added to ensure Vdd' leads the clock frequency change. This ensures that there is no long-term Vmin increase necessary as indicated by 601 where Vdd' (the boosted Vdd) reaches back to the expected Vdd. As such, Vmin increase penalty shown in plot 700 is eliminated.

Figure 9:
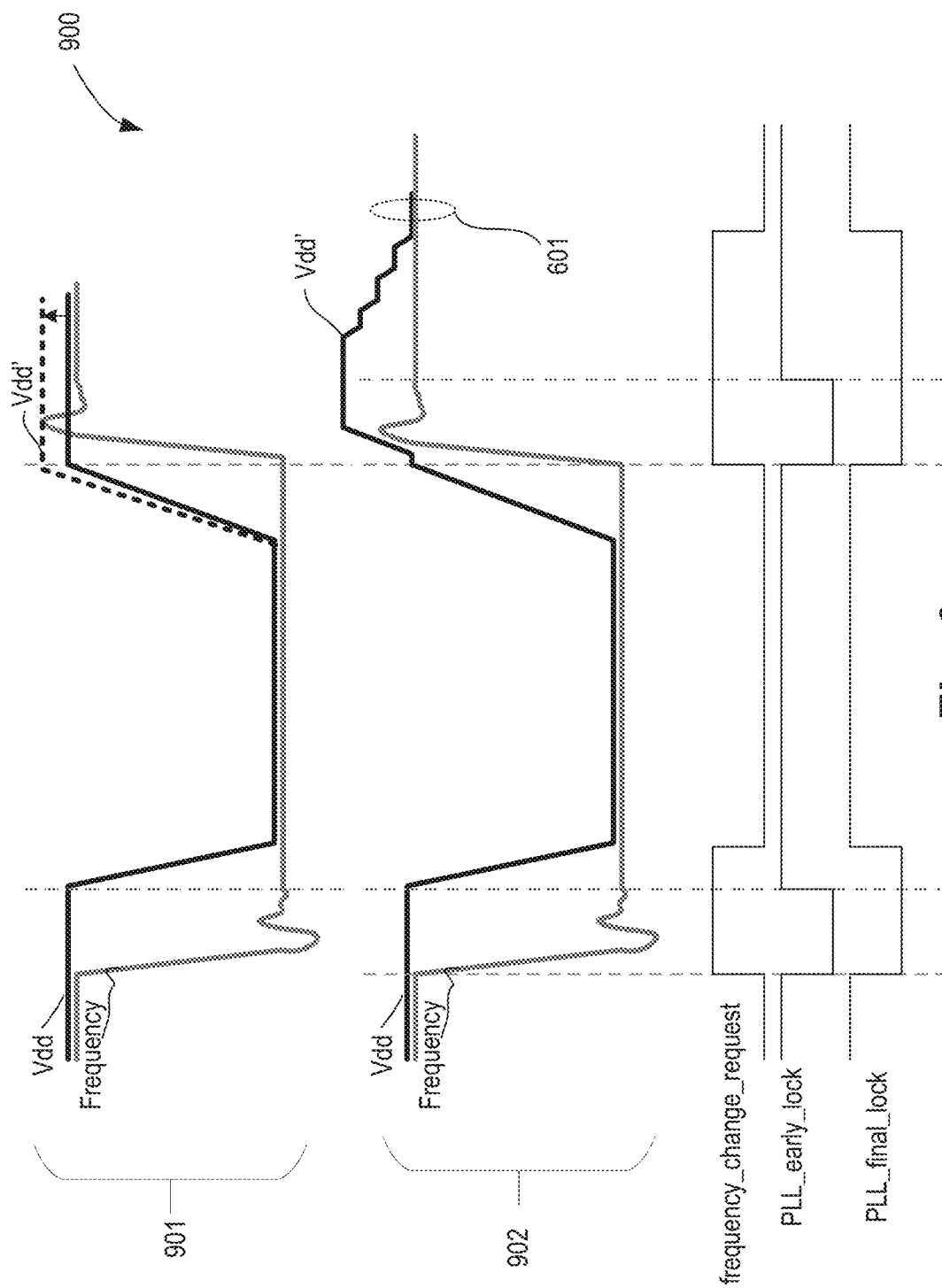
FIG. 9 illustrates plots showing impact on Vmin (minimum operating voltage) with and without a temporary power supply voltage (and/or current) boost after exiting a low power voltage state, in accordance with some embodiments.

FIG. 9 illustrates plot 900 showing impact on Vmin (minimum operating voltage) with and without a temporary power supply voltage (and/or current) boost after exiting a low power voltage state, in accordance with some embodiments. While FIGS. 5-8 illustrate cases where Vdd suffers from voltage droop and subsequent frequency overshoot upon exit of the droop, plot 900 illustrates the case where frequency change request is made for changing the clock frequency for a period of time, and then bringing the clock frequency back to the previous level or a different but higher level. The clock frequency change request may come from any authorized source. For example, the operating system may want to increase or decrease the clock frequency to meet a particular performance requirement. In another example, processor 100 may decide to enter a low power state where frequency is lowered or clock is halted, and then processor 100 decides to function in higher power state with higher clock frequency.

In this example, when frequency_change_request is asserted, the clock frequency is lowered by PLL 103. Due to change in clock frequency, PLL 103 loses lock which is indicated by the de-assertion of both early and late lock indicators, PLL_early_lock and PLL_final_lock, respectively. Once the clock frequency is lowered, PLL 103 regains lock and re-asserts early lock first and then the final or late lock. During the downward frequency transition, the clock frequency is lowered before lowering the voltage Vdd while during an upward transition, the voltage Vdd (now shown as Vdd') is raised before increasing the clock frequency. However, the clock frequency overshoot can use a long-term Vmin increase just to absorb the overshoot resulting in a power increase and/or performance hit as indicated by plot 901. The increase in Vmin is indicated by the difference in voltage between Vdd and Vdd' of plot 901.

Plot 902 shows the case when PLL 103 or PCU 105 requests a voltage boost to supply voltage Vdd (now shown as Vdd'). This voltage boost occurs when clock frequency is requested to rise back to the previous or new level, as indicated by the second frequency_change_request pulse. This boost is temporary to absorb any clock frequency overshoot and to avoid a long-term Vmin increase. Due to increase in clock frequency, PLL 103 loses lock again and both PLL_early_lock and PLL_final_lock are de-asserted. In some embodiments, when PLL 103 regains lock as indicated by the PLL_early_lock, PLL 103 or PCU 105 requests VR 101 to reduce Vdd' back to its expected lower level. As discussed with reference to FIG. 6, the boosted Vdd' is lowered in a step-wise fashion (or a single step or ramp) so that the PLL does not lose early lock indication, and when Vdd' reaches its expected stable level, clock frequency is also stabilized and PLL_final_lock is then asserted.

Figure 10:
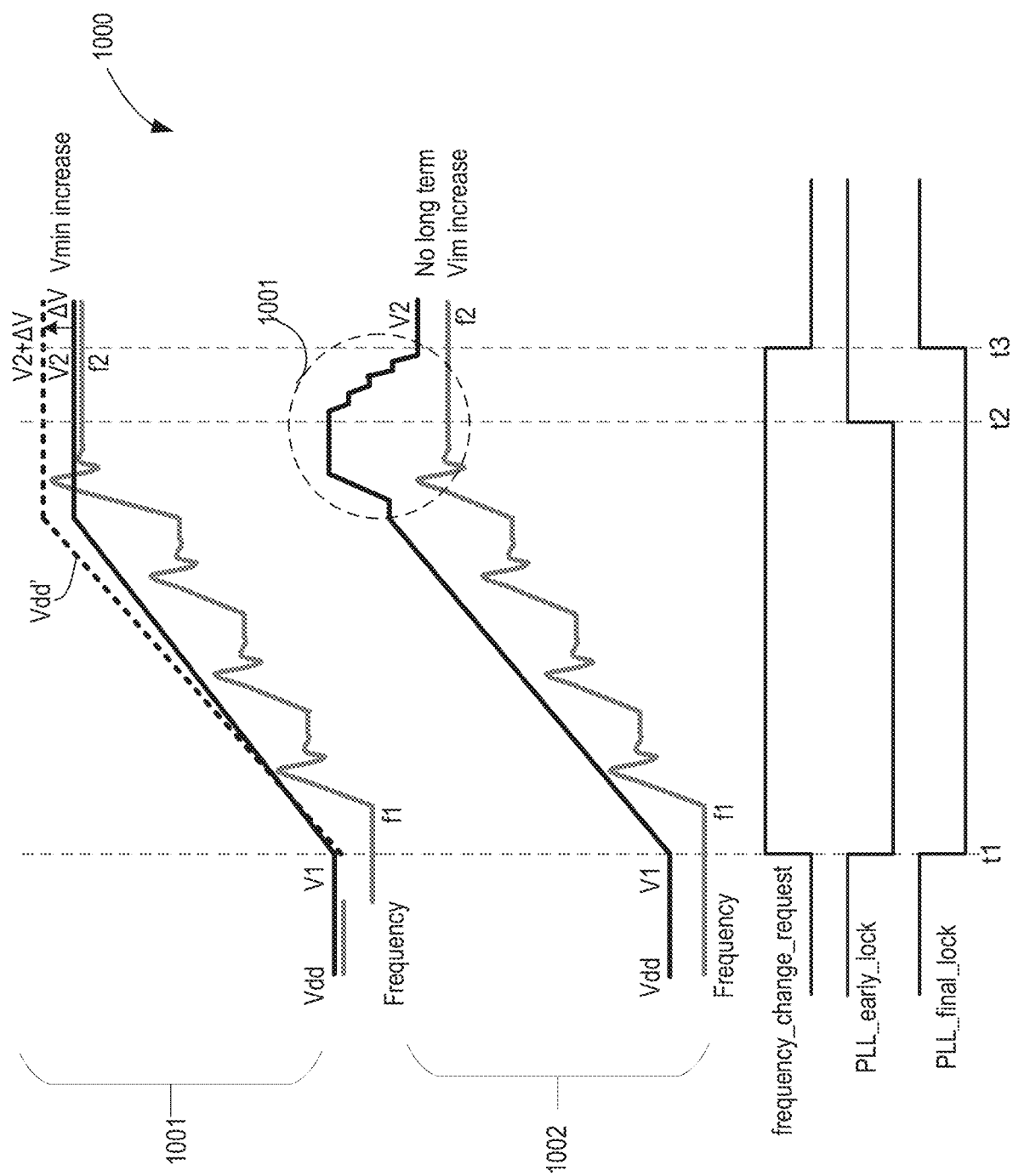
FIG. 10 illustrates plots showing frequency crawl without power supply boost, and with power supply boost, respectively, in accordance with some embodiments.

FIG. 10 illustrates plot 1000 showing frequency crawl without power supply boost, and with power supply boost, respectively, in accordance with some embodiments. Frequency crawl is a scheme wherein clock frequency and supply voltage Vdd are slowly ramped up to a new level. In this example, the initial Vdd is V1 and initial clock frequency is f1, and the final voltage supply level and clock frequency are V2 and f2, respectively. The frequency ramp may be a step-by-step ramp (or a single step or ramp) while the voltage ramp may be a slow ramp. Upon each frequency ramp, some frequency overshoot is observed which raises Vmin as indicated by Vdd' of plot 1001. When the system, in the absence of the temporary voltage boost apparatus, reaches the final voltage V2 for Vdd and final frequency f2, Vmin increases by ΔV to absorb the frequency overshoot. This increase in Vmin results in power increase and/or performance hit for processor 100. Using VID boost based on frequency change request (frequency_change_request) and early lock assertion by PLL 103 (PLL_early_lock), no long-term Vmin increase is needed as shown by plot 1002.

Frequency crawl begins to happen when clock frequency is requested to rise in a step-by-step fashion as indicated by the frequency_change_request pulse. When the frequency_change_request is asserted, the clock frequency is raised by PLL 103 in short increments. Each step-up increment causes a frequency overshoot. Due to change in clock frequency, PLL 103 loses lock, which is indicated by the de-assertion of both early and late lock indicators, PLL_early_lock and PLL_final_lock, respectively. As described before, when the phase difference between Up and Dn pulses is larger than a threshold, PLL 103 losses lock.

Upon the last or second to last frequency step increase, PLL 103 or PCU 105 requests a temporary boost to Vdd by instructing VR 101 to increase its output supply voltage which is provided logic 104. Upon increase in Vdd, PLL 103 regains lock and re-asserts early lock first. The boost to Vdd temporary absorbs any clock frequency overshoot and avoids a long-term Vmin increase. In some embodiments, when PLL 103 regains lock as indicated by the PLL_early_lock, PLL 103 or PCU 105 requests VR 101 to reduce Vdd back to its expected lower level. For example, at t2 boosted Vdd' is lowered in a step-wise fashion so that the PLL 103 does not lose early lock indication, and when Vdd reaches its expected stable level, clock frequency is also stabilized and PLL_final_lock is then asserted at t3.

Figure 11:
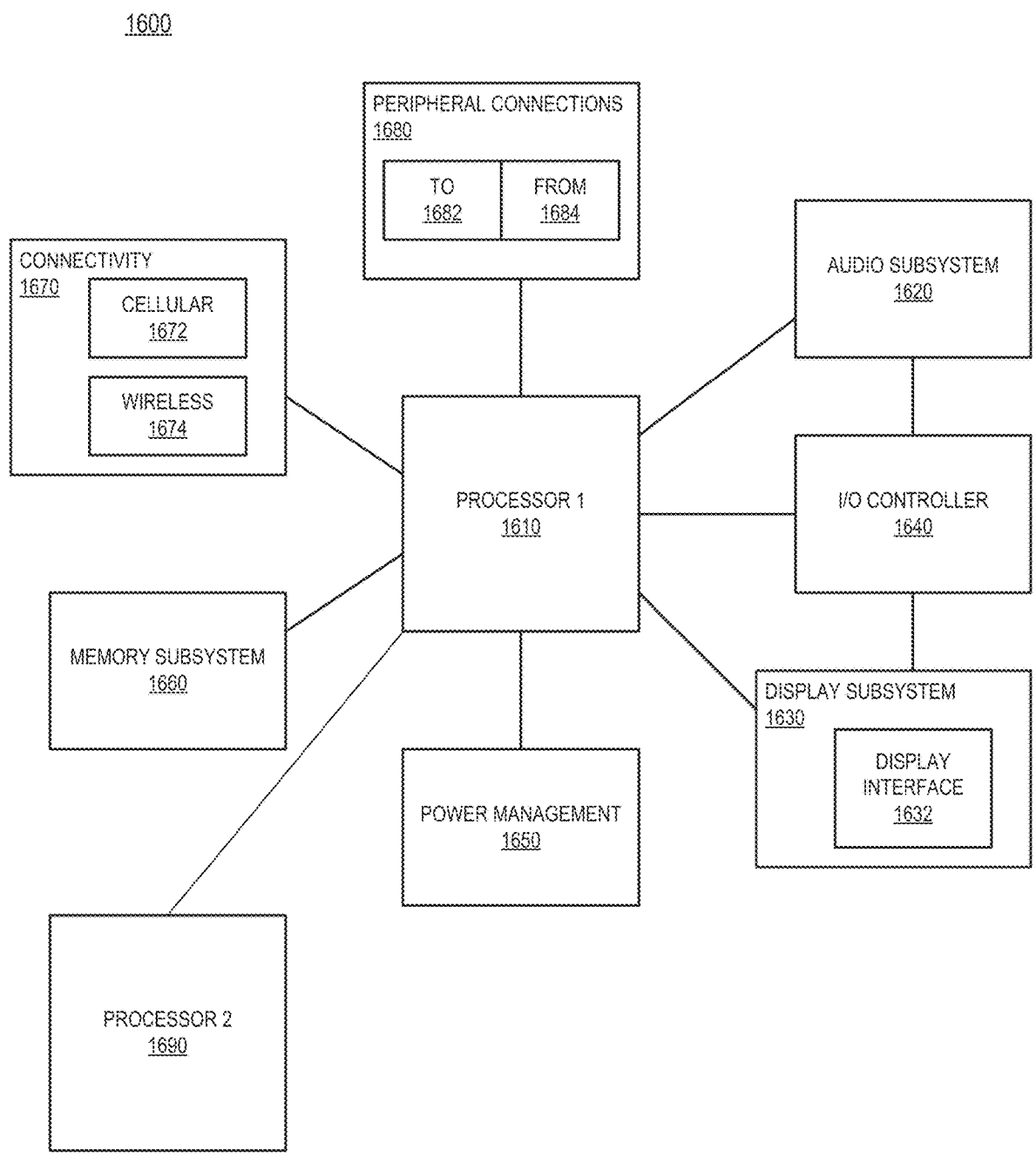
FIG. 11 illustrates a smart device or a computer system or a SoC (System-on-Chip) having apparatus to temporarily boost power supply of a logic (e.g., processor core) to mitigate frequency overshoot, according to some embodiments of the disclosure.

FIG. 11 illustrates a smart device, or a computer system, or a SoC (System-on-Chip) having apparatus to temporarily boost power supply of a PLL to mitigate frequency overshoot, according to some embodiments of the disclosure. FIG. 11 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes processor with apparatus to temporarily boost power supply to mitigate frequency overshoot, according to some embodiments discussed. Other blocks of the computing device 1600 may also include an apparatus to temporarily boost power supply to mitigate frequency overshoot, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

EXAMPLE 1

An apparatus comprising: a first circuitry to detect a voltage droop on a power supply rail; and a second circuitry to request an increase in voltage and/or current on the power supply rail in response to the voltage droop detection, wherein the voltage and/or current on the power supply rail is to increase above an expected nominal voltage and/or current level before the voltage droop ends, and wherein the second circuit is to further request a decrease, after the voltage droop ends, in the voltage and/or current on the power supply rail after a predetermined or programmable time.

EXAMPLE 2

The apparatus of example 1 comprising: clock generating source to generate an early lock signal and a late lock signal in accordance with a phase difference between a reference clock and a feedback clock, and wherein the second circuitry is to receive the early lock indication to determine when to request the decrease in the voltage and/or current on the power supply rail.

EXAMPLE 3

The apparatus of example 1, wherein the second circuitry is to decrease the voltage and/or current on the power supply rail to the expected nominal voltage and/or current level.

EXAMPLE 4

The apparatus of example 1, wherein the second circuitry is to decrease the voltage and/or current in a step-wise manner

EXAMPLE 5

The apparatus of example 1, wherein the second circuitry is to request a voltage regulator to increase the voltage and/or current on the power supply rail in response to the voltage droop detection.

EXAMPLE 6

The apparatus of example 1, wherein the second circuitry is to generate a new voltage identification (VID) code in response to the voltage droop detection.

EXAMPLE 7

An apparatus comprising: a first circuitry to detect a frequency change request for a processor; and a second circuitry to request an increase in voltage and/or current on the power supply rail in response to the frequency change request detection, wherein the second circuitry is to request a decrease, after an early lock indication associated with a clock generation source, in the voltage and/or current on the power supply rail after a predetermined or programmable time.

EXAMPLE 8

The apparatus of example 7, wherein the clock generation source comprises: a phase locked loop (PLL) to generate the early lock indication, prior to a late lock indication, in accordance with a phase difference between a reference clock and a feedback clock, and wherein the second circuitry is to receive the early lock indication to determine when to request the decrease in the voltage and/or current on the power supply rail.

EXAMPLE 9

The apparatus of example 7, wherein the second circuitry is to decrease the voltage and/or current on the power supply rail to an expected nominal voltage and/or current level.

EXAMPLE 10

The apparatus of example 7, wherein the second circuitry is to decrease the voltage and/or current in a step-wise manner

EXAMPLE 11

The apparatus of example 7, wherein the second circuitry is to request a voltage regulator to increase the voltage and/or current on the power supply rail in response to the frequency change request.

EXAMPLE 12

The apparatus of example 1, wherein the second circuitry is to generate a new voltage identification (VID) code in response to the frequency change request.

EXAMPLE 13

A system comprising: a memory; a voltage regulator (VR); a processor core coupled to the VR and the memory, wherein the processor core includes: a first circuitry to detect a change in a performance parameter; and a second circuitry to request the VR to temporarily increase a voltage and/or current on a power supply rail in response to the detection of the performance parameter, wherein the second circuitry is to request a decrease in the voltage and/or current on the power supply rail after a predetermined or programmable time; and an antenna to allow the processor core to communicate with another device.

EXAMPLE 14

The system of example 13, wherein the first circuitry comprises: a comparator to compare a filtered version of the voltage and/or current on the power supply rail against a threshold, and to generate a voltage droop detection when the filtered version of the voltage and/or current cross the threshold, wherein the voltage droop detection is the performance parameter.

The system of example 13, wherein the second circuitry is to generate a new voltage identification (VID) code in response to the voltage droop detection.

The system of example 13, wherein the second circuitry is to generate a pulse having a pulse width associated with a duration of the voltage droop detection, wherein the pulse width is extended by a time to ensure the voltage on the power supply rail changes before a frequency of a clock of the processor core changes.

The system of example 13 comprising: a phase locked loop (PLL) to generate an early lock indication and a late lock indication in accordance with a phase difference between a reference clock and a feedback clock, wherein the PLL is coupled to the power supply rail, and wherein the second circuitry is to receive the early lock indication to determine when to request the decrease in the voltage and/or current on the power supply rail.

The system of example 13, wherein the second circuitry is to decrease the voltage and/or current on the power supply rail to the expected nominal voltage and/or current level.

The system of example 13, wherein the second circuitry is to decrease the voltage and/or current in a step-wise manner.

The system of example 13, wherein the performance parameter is one of: a voltage droop of a voltage on the power supply rail; a clock frequency for the processor core; or a power state for the processor core.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a plurality of processor cores coupled to a power supply rail that supplies a power supply voltage and/or current for the plurality of processor cores;
   a voltage regulator to provide the power supply voltage and/or current to the power supply rail;
   a clock source to provide a phase or frequency locked clock to the plurality of processor cores; and
   a power controller coupled to the plurality of processor cores, wherein the power controller is to request the clock source to increase a frequency of the phase or frequency locked clock in a step-by-step fashion such that for each step increase in the frequency, the clock source loses a locked condition of the phase or frequency locked clock, wherein the power controller is to request the voltage regulator to increase the power supply voltage and/or current in a ramp, and then a temporary boost above the ramp upon a last or second to last step increase in the frequency.

2. The apparatus of claim 1, wherein the clock source acquires a first locked condition after the temporary boost in the power supply voltage and/or current, and then acquires a second locked condition after the first locked condition.

3. The apparatus of claim 2, wherein the power controller instructs the clock source to reduce the power supply voltage and/or current after the first locked condition is acquired.

4. The apparatus of claim 2, wherein the power controller instructs the clock source to reduce the power supply voltage and/or current in a step-by-step fashion after the first locked condition is acquired.

5. The apparatus of claim 2, wherein the power controller instructs the clock source to reduce the power supply voltage and/or current till the second locked condition is acquired.

6. The apparatus of claim 2, wherein the first locked condition is an early locked condition indicative of a phase or frequency difference between two signals of the clock source, and wherein the second locked condition is a late locked condition which is a filtered version of the early locked condition.

7. The apparatus of claim 1, wherein the voltage regulator is one of: an integrated voltage regulator, an analog low dropout regulator, an all-digital low dropout regulator, or a mixed-signal low dropout regulator.

8. The apparatus of claim 1, wherein the clock source is a phase locked loop or a frequency locked loop.

9. A system-on-chip comprising:
   a memory;
   a processor coupled to the memory; and
   an antenna communicatively coupled to the processor, wherein the processor includes:
      a plurality of processor cores coupled to a power supply rail that supplies a power supply voltage and/or current for the plurality of processor cores;
      a voltage regulator to provide the power supply voltage and/or current to the power supply rail;
      a clock source to provide a phase or frequency locked clock to the plurality of processor cores; and
      a power controller coupled to the plurality of processor cores, wherein the power controller is to request the clock source to increase a frequency of the phase or frequency locked clock in a step-by-step fashion such that for each step increase in the frequency, the clock source loses a locked condition of the phase or frequency locked clock, wherein the power controller is to request the voltage regulator to increase the power supply voltage and/or current in a ramp, and then a temporary boost above the ramp upon a last or second to last step increase in the frequency.

10. The system of claim 9, wherein the clock source acquires a first locked condition after the temporary boost in the power supply voltage and/or current, and then acquires a second locked condition after the first locked condition.

11. The system of claim 10, wherein the power controller instructs the clock source to reduce the power supply voltage and/or current after the first locked condition is acquired, or wherein the power controller instructs the clock source to reduce the power supply voltage and/or current in a step-by-step fashion after the first locked condition is acquired.

* * * * *